United States Patent

Imanishi et al.

[11] Patent Number: 5,912,429
[45] Date of Patent: Jun. 15, 1999

[54] HIGH TEMPERATURE THERMOELECTRIC MATERIAL AND ITS PRODUCTION METHOD

[75] Inventors: Yuichiro Imanishi; Makoto Miyoshi, both of Nagoya; Kazuhiko Shinohara; Masakazu Kobayashi, both of Yokohama, all of Japan

[73] Assignees: NGK Insulators, Ltd.; Nissan Motor Co., Ltd., both of Japan

[21] Appl. No.: 08/820,025

[22] Filed: Mar. 19, 1997

[30] Foreign Application Priority Data

Mar. 19, 1996 [JP] Japan .................................. 8-062640

[51] Int. Cl.⁶ ........................... H01L 35/18; H01L 35/34; C22C 12/00
[52] U.S. Cl. .................. 136/240; 136/201; 136/236.1; 252/62.3 T; 419/31; 419/38; 419/44; 419/53; 419/55; 419/56; 419/57; 420/576
[58] Field of Search ................... 136/201, 236.1, 136/238, 240; 419/31, 38, 44, 53, 55, 56, 57; 252/62.3 T; 420/576

[56] References Cited

U.S. PATENT DOCUMENTS

| | | | |
|---|---|---|---|
| 3,454,370 | 7/1969 | Castellion | 23/315 |
| 3,840,652 | 10/1974 | Albers | 423/509 |
| 5,610,366 | 3/1997 | Fleurial et al. | 136/202 |

FOREIGN PATENT DOCUMENTS

WO 95/04377  2/1995  WIPO.

OTHER PUBLICATIONS

L.D. Dudkin and N.Kh. Abrikosov: "On the Doping of the Semiconductor Compound $CoSb_3$" pp. 126–133, Jan. 1958.

B.N. Zobrina and L.D. Dudkin: "Investigation of the Thermoelectric Properties of $CoSb_3$ with Sn, Te and Ni Impurities" pp. 1668–1674, Dec., 1959.

K. Matsubara, T. Iyanaga, T. Tsubouchi, K. Kishimoto and T. Koyanagi: "Thermoelectric Properties of (pd, Co) $Sb_3$ Compounds with Skutterudite Structure", 1995, pp. 226–229 Am. Inst. of Physics.

Thierry Caillat, Alex Borshchevsky and Jean–Pierre Fleurial: "Preparation and Thermoelectric Properties of p– and n–Type $CoSb_3$"; 1995 American Institute of Physics, pp. 58–61.

"Investigations of Several New Advanced Thermoelectric Materials at the Jet Propulsion Laboratory"; T. Caillat et al.; Proceedings Intersociety Energy Conversion Engineering Conference, Boston, 14th, 1979; Aug. 8, 1993 pp. 1.245–1.248, XP000428309 *p. 1245, paragraph 1*.

*Primary Examiner*—Kathryn Gorgos
*Assistant Examiner*—Chrisman D. Carroll
*Attorney, Agent, or Firm*—Parkhurst & Wendel, L.L.P.

[57] ABSTRACT

Thermoelectric material for high temperature use made of a sintered body of a relative density of at least 75% consisting mainly of cobalt antimony compounds having an elemental ratio Sb/(Co+additives)=x of 2.7<x<3 is produced by a method of firing a shaped body of powders consisting mainly of cobalt and antimony in a non-oxidizing atmosphere under an environmental pressure, wherein the shaped body before the firing is constituted from crystal phases composed of a cubic crystal system compound $CoSb_3$ (A phase), a monoclinic crystal system compound $CoSb_2$ (B phase) and a hexagonal crystal system compound CoSb (C phase), and constitutional ratio of these crystal phases is $(I_B+I_C)/(I_A+I_B+I_C)<0.15$ (wherein, $I_X$ (X is A, B or C) is a relative intensity by X-ray diffraction).

4 Claims, 5 Drawing Sheets

□ Heat treatment twice
◇ Heat treatment once

FIG. 6

□ Electric power factor
◇ Seebec coeff.

HIGH TEMPERATURE THERMOELECTRIC MATERIAL AND ITS PRODUCTION METHOD

BACKGROUND OF THE INVENTION

1. Field of the Invention

The present invention relates to a thermoelectric material for high temperature use which is used for thermoelectric power generation based on the Seebeck effect or a so-called Peltier's thermoelectric effect of electronic freezing and the like effect of direct energy conversion without using a movable part, and its production method.

2. Related Art Statement

Thermoelectric conversion, such as, thermoelectric power generation and electronic freezing, using a thermoelectric material allows production of a simplified direct energy conversion apparatus of a simple, reliable, long serviceable and maintenance-easy structure not having a movable part which is a cause of vibration, noise and abrasion, etc. It is suited to direct generation of a direct current by combustion of various fossil fuels or temperature control without using a cooling medium.

In evaluating characteristic properties of a thermoelectric conversion material, an electric power factor Q or a Figure-of-Merit Z are used which are expressed by the following formulae.

$$Q = \sigma \alpha^2$$

$$Z = \frac{\sigma \alpha^2}{\kappa}$$

wherein, $\alpha$ is Seebeck coefficient, $\sigma$ is an electric conductivity, and K is a thermal conductivity. In thermoelectric materials, a large Figure-of-Merit Z is desired. Namely, a higher Seebeck coefficient, a higher electric conductivity $\sigma$, and a higher thermal conductivity are desired.

In case of using a thermoelectric material for thermoelectric power generation, the thermoelectric material is required to have a high Figure-of-Merit Z of at least $Z=3\times10^{-3}$/K and function stably for a long time in the environmental atmosphere. In case of mass producing a thermoelectric material for automobile vehicle use or waste heat utilization purpose, a thermoelectric material having a non-degradable character, a sufficient strength and heat durability at high temperatures is particularly desired, as well as an economical and efficient production method thereof. Heretofore, as such a thermoelectric material, use has been made of Pb, Te, silicide compounds, such as, $MSi_2$ (wherein, M is Cr, Mn, Fe or Co), etc., or mixtures thereof.

Examples of thermoelectric materials having a Sb compound, such as $TSb_3$ (wherein, T is Co, Ir or Ru), for example, $CoSb_3$ as a main component and an impurity added for deciding the electric conductivity type are described in the following literatures.

1) L. D. Dudkin and N. Kh. Abrikosov, Soviet Physics Solid State Physics (1959) pp.126–133

2) B. N. Zobrina and, L. D. Dudkin, Soviet Physics Solid State Physics (1960) pp.1668–1674

3) K. Matsubara, T. lyanaga, T. Tsubouchi, K. Kishimoto and T. Koyanagi, American Institute of Physiks (1995) pp.226–229.

A thermoelectric material consisting of PbTe has a large Figure-of-Merit Z of about $1\times10^{-3}$/K at around 400° C., however, it contains a volatile component Te in the raw material composition, so that it has a low melting point and a weak chemical stability and hence cannot be used at high temperatures of exceeding 500° C. Moreover, because the thermoelectric material contains the volatile matter Te and hence its production process is rather complicated, its characteristic properties are liable to fluctuate due to fluctuation of the composition, so that efficient mass production is impossible. In addition, the raw materials per se of the thermoelectric material are expensive and highly noxious.

Meanwhile, silicide compounds, such as, $MSi_2$ (M=Cr, Mn, Fe, Co) and silicide series materials, such as, mixtures of the silicide compounds can be produced from cheap and innoxious raw materials, and they are chemically stable and can be produced even at a temperature region of about 800° C. For example, they can be produced by a relatively economical production method as described in Isao Nishida and Kinichi Kamimura "Thermoelectric materials and their applications" pp. 176–180 (1983). However, silicide series materials could not have sufficient thermoelectric properties comparable to PbTe in that their Figures-of-Merit Z are about $(1–2)\times10^{-4}$/K which are one order smaller than PbTe.

Thermoelectric materials $TSb_3$ (T=Co, Ir, Ru) and the like Sb compounds, such as, thermoelectric materials composed mainly of $CoSb_3$, can be produced from cheap and innoxious raw materials and are known to have relatively high Figures-of-Merit Z of $<1\times10^{-3}$/K.

It is known that, in the heretofore known thermoelectric materials having $CoSb_3$ in their chemical compositions, the produced materials should be composed solely of a crystal phase $CoSb_3$ of cubic crystal system and the other crystal phases CoSb, $CoSb_2$ and Sb should be removed for the sake of their function of decreasing the thermoelectric properties. However, in practice, in the method of producing $CoSb_3$ by melting, it is known that foreign phases COSb, $CoSb_2$ and Sb other than $CoSb_3$ are precipitated at the time of solidification, and a heat treatment of a temperature of around 600° C. for about 200 hrs is needed for converting the melted materials to the sole crystal phase of $CoSb_3$, so that a long time-consuming production process is required.

In a prior method of producing $CoSb_3$ by pulverizing and sintering melted materials of $CoSb_3$, foreign crystal phases CoSb and $CoSb_2$ precipitated at the time of melting and having higher densities than $CoSb_3$ are phase changed to $CoSb_3$ at the time of sintering, so that a problem of volumetric expansion arises to obstruct the proceeding of the sintering. For example, even when the melted materials are hot pressed at a condition of a pressure of $5\times10^3$ kg/cm$^2$ and a temperature of 600° C., a sufficiently densified material could not been obtained (refer to K. Matsubara, T. Iyanaga, T. Tsubouchi, K. Shimamoto and T. Kobayashi "American Institute of Physics" pp. 226–229 (1995), wherein the density of $CoSb_3$ of cubic crystal system is reported as 5.25 g/cm$^3$ at the maximum, whereas the theoretical density of $CoSb_3$ is 7.64 g/cm$^3$) As a result, the produced sintered body is very brittle and has an insufficient strength at high temperatures.

Therefore, in order to apply a thermoelectric material to electric power generation apparatuses of automobile cars using waste heat of the automobile cars, a thermoelectric material has been earnestly desired which is chemically stable and hardly deteriorated on its characteristic properties and has a sufficient heat resistant property at high temperatures of not less than 600° C. Particularly, a thermoelectric material for high temperature use has been eagerly desired which has a high strength and thermoelectric properties at high temperatures.

An industrial method of economically and efficiently producing such a thermoelectric material for high temperature use, has also been desired.

SUMMARY OF THE INVENTION

An object of the present invention is to obviate such prior problems.

Another object of the present invention is to provide a cheap thermoelectric material for high temperature use which has superior thermoelectric properties and a sufficient heat resistant property at high temperatures and is chemically stable and hardly deteriorated on the thermoelectric properties at high temperatures.

A further object of the present invention is to provide a novel method of producing such a thermoelectric material.

Now, the above objects can be achieved by the present invention.

The present invention is a thermoelectric material for high temperature use composed of a sintered body having a relative density of not less than 75% and consisting mainly of cobalt·antimony compounds, characterized in that it has an elemental ratio $x=Sb/(Co+additives)$ of $2.7<x<3$ in the chemical composition. In preferred embodiments of the present invention, the crystal phases constituting the main components cobalt·antimony compounds are composed of a cubic crystal system compound $CoSb_3$ (A phase), a monoclinic crystal system compound $CoSb_2$ (B phase) and a hexagonal crystal system compound $CoSb$ (C phase), and constitutional ratio of these crystal phases is $(I_B+I_C)/(I_A+I_B+I_C)<0.15$ (wherein, IX (X is A, B or C) is a relative intensity of X-ray diffraction) defined by intensity ratios measured by X-ray diffraction.

Also, the present invention is a method for producing a thermoelectric material for high temperature use, comprising firing a shaped body of powders consisting mainly of cobalt and antimony in a non-oxidizing atmosphere under an environmental pressure, the shaped body being constituted from crystal phases of a cubic crystal system compound $CoSb_3$ (A phase), a monoclinic crystal system compound $CoSb_2$ (B phase) and a hexagonal crystal system compound $CoSb$ (C phase), and constitutional ratio of these crystal phases being $(I_B+I_C)/(I_A+I_B+I_C)<0.15$ (wherein, IX (X is A, B or C) is a relative intensity of X-ray diffraction) defined by intensity ratios measured by X-ray diffraction. The shaped body before the firing has a characteristic feature that it was obtained by press shaping and heat treating a powder having an elemental ratio $y=Sb/(Co+additives)$ of $2.7<y<3$, and further press shaping or press shaping after pulverizing.

BRIEF DESCRIPTION OF THE DRAWING

For a better understanding of the present invention, reference is made to the accompanying drawings, in which.

Hereinafter, the present invention will be explained in more detail.

DETAILED DESCRIPTION OF THE INVENTION

The thermoelectric material for high temperature use of the present invention relates to a thermoelectric material consisting mainly of cobalt antimony compounds and includes Co-Sb series materials having a fundamental structure of $CoSb_3$ added with a minor amount of additive for deciding the conductivity type, such as, $Co_{1-y}M_ySb_3$ (wherein, M is Ni, Fe and/or Ru) and $Co(Sb_{1-y}T_y)_3$ (wherein, T is Sn, Te, Se and/or Pb).

The thermoelectric material for high temperature use of the present invention relates to a thermoelectric material composed of a sintered body consisting mainly of cobalt·antimony compounds and the sintered body is required to have a relative density of at least 75%. If the relative density exceeds 75%, the thermoelectric material has a high strength at high temperatures and high thermoelectric properties without damaging its electric properties, while if the relative density is less than 75% the thermoelectric properties, particularly electric conductivity, of the thermoelectric material become noticeably inferior and its strength becomes noticeably inferior. Thus, the sintered body is required to have a relative density of at least 75%.

The thermoelectric material for high temperature use of the present invention is also required that its elemental ratio $X=Sb/(Co+additives)$ is within a range of $2.7<X<3$. If the ratio X is $3 \leq X$, an Sb phase having a low melting point is facilitated to precipitate, so that the thermoelectric material becomes unstable at temperature regions exceeding 600° C., while if the ratio X is $X \leq 2.7$, the volumetric proportion of $CoSb_3$ which has high thermoelectric properties is decreased, so that the thermoelectric properties of the thermoelectric material are deteriorated. Thus, the sintered body is required to have an elemental ratio X of $2.7<X<3$.

The thermoelectric material for high temperature use of the present invention has a feature that the crystal phases constituting the main components cobalt·antimony compounds are composed of a cubic crystal system compound $CoSb_3$ (A phase), a monoclinic crystal system compound $CoSb_2$ (B phase) and a hexagonal crystal system compound $CoSb$ (C phase), wherein these crystal phases preferably has a constitutional ratio of $(I_B+I_C)/(I_A+I_B+I_C)<0.15$ (wherein, IX (X is A, B or C) is a relative intensity of X-ray diffraction) defined by relative intensity ratios measured by X-ray diffraction. In case when $CoSb_2$ or $CoSb$ is contained in such an amount that the relative intensity ratios measured by X-ray diffraction satisfy the constitutional ratio of $(I_B+I_C)/(I_A+I_B+I_C)<0.15$, the thermoelectric material substantially does not contain the Sb phase of a low melting point and constituted solely from the compounds which are stable even at a high temperature range of 800° C., so that Sb is not precipitated even when the thermoelectric material is exposed to a high temperature and hence the thermoelectric material has a sufficient heat resistant property and chemical stability and its characteristic properties are hardly deteriorated at high temperatures. However, in case when the constitutional ratio of $(I_B+I_C)/(I_A+I_B+I_C) \geq 0.15$, the volumetric proportion of $CoSb_3$ having high thermoelectric properties is decreased and the volumetric proportions of $CoSb$ and $CoSb_2$ become excessively large to function as factors of scattering the conductive carriers and simultaneously induce decrease of the Seebeck coefficient, so that the thermoelectric properties are decreased. Thus, the constitutional ratio of $(I_B+I_C)/(I_A+I_B+I_C)<0.15$ is desirable.

The method of producing the thermoelectric material for high temperature use according to the present invention relates to a method of producing a thermoelectric material for high temperature use wherein a shaped body of powders consisting mainly of cobalt and antimony is fired in a non-oxidizing atmosphere. In the circumstance, as the non-oxidizing atmosphere are mentioned an inert atmosphere, such as, argon or nitrogen, a reducing atmosphere, such as, hydrogen, a weak reducing atmosphere which uses graphite as the container or which simultaneously heat treat a graphite chip, or a mixed atmosphere thereof.

The method of producing the thermoelectric material for high temperature use according to the present invention has a characteristic feature that the shaped body before the firing is obtained by press shaping and subsequent heat treating a powder having an elemental ratio y=Sb/(Co+additives) of 2.7<x<3 and further press shaping or press shaping after pulverizing. In the circumstance, as the powders are mentioned a mixture of raw material powders consisting mainly of weighed cobalt and antimony, a powder obtained by pulverizing a molten member consisting mainly of cobalt and antimony of desired amounts, or a mixture thereof having a desired proportion of elements.

The method of producing the thermoelectric material for high temperature use according to the present invention includes a step of firing a shaped body of powders consisting mainly of cobalt and antimony in a non-oxidizing atmosphere, and has a characteristic feature that the shaped body is constituted from the crystal phases consisting of a cubic crystal system compound $CoSb_3$ (A phase), a monoclinic crystal system compound $CoSb_2$ (B phase) and a hexagonal crystal system compound CoSb (C phase). In the circumstance, the shaped body of powders should have the constitutional ratio of the crystal phases of $(I_B+I_C)/(I_A+I_B+I_C)<0.15$ calculated from measured values of relative intensities by X-ray diffraction. Preferably the thermoelectric material having the constitutional ratio of the crystal phases of $(I_B+I_C)/(I_A+I_B+I_C)<0.15$ is obtained as the final product. However, by virtue of using the shaped body of powders having the ratio of $(I_B+IC)/(I_A+I_B+I_C)<0.15$, the phase changes occurring at the time of the heat treatment is substantially prevented, so that the volumetric expansion can be prevented from occurring and appropriate sintering can be proceeded and the thermoelectric material having the above constitutional ratio of the crystal phases, a sufficient heat resistant property and a superior chemical stability at high temperatures and a high relative density can be provided simply by using the general sintering method. Thus, the shaped body having the constitutional ratio of the crystal phases of $(I_B+I_C)/(I_A+I_B+I_C)<0.15$ measured by relative intensities by X-ray diffraction should be used.

In order to obtain the fired shaped body having the above ratio of $(I_B+I_C)/(I_A+I_B+I_C)<0.15$ calculated from measured values of relative intensities by X-ray diffraction, a shaped body of powders before the firing is preferably used which is obtained by press forming a powder mixture of an elemental ratio Sb/(Co+additives)=y of 2.7<x<3, heat treating the formed mixture, and further press forming the heat treated mixture or pulverizing and press forming the heat treated mixture. In the circumstance, preferably the shaped body before the firing has the elemental ratio Sb/(Co+additives)=y of 2.7<x<3. Preferably the shaped body of powders before the firing has a relative intensity ratio of $(I_B+I_C)/(I_A+I_B+I_C)<0.15$ measured by X-ray diffraction. By heat treating the powders of the elemental ratio Sb/(Co+additives)=y of 2.7<x<3, the Sb phase is substantially prevented from precipitation and excessive amounts of CoSb and $CoSb_2$ are not contained and the shaped body before the firing having an elemental ratio Sb/(Co+additives)=y of 2.7<x<3 can be obtained thereby to further appropriately proceed the sintering process.

In addition, as compared with the process of heat treating a molten ingot having a plenty of segregations, the heat treatment of the shaped body or agglomerate of powders can reduce the time required for the diffusion of elements up to the homogenization of the shaped body, so that the shaped body of powders having a homogeneous composition can be obtained simply, easily and economically.

DESCRIPTION OF PREFERRED EMBODIMENTS

Hereinafter, the present invention will be explained in more detail with reference to examples.

Examples 1–7 and Comparative Examples 11–15

Figure 1:
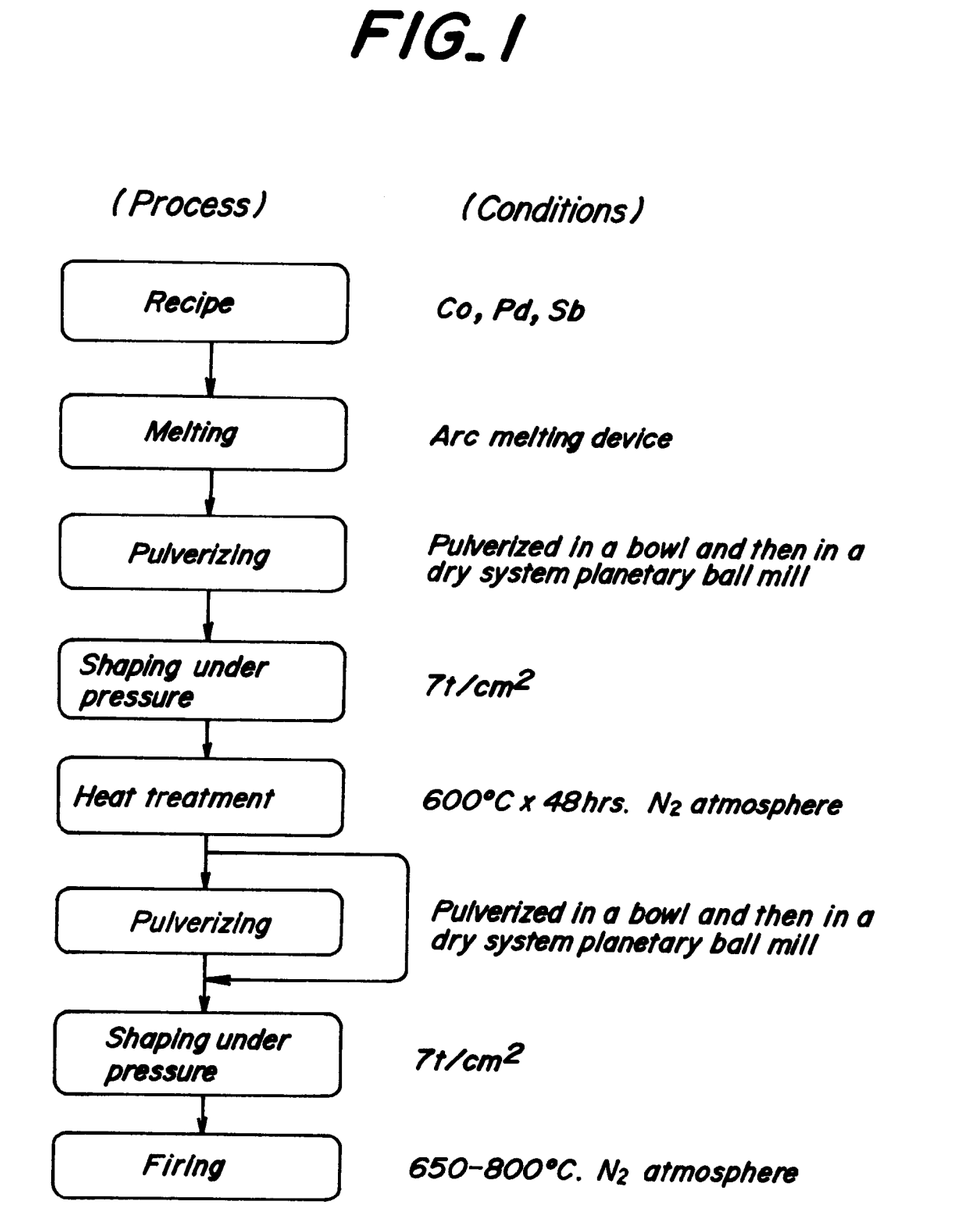
FIG. 1 is a flow chart illustrating an example of the production method of the present invention.

Samples of the Examples 1–7 of the present invention were prepared based on the preparation procedures shown in FIG. 1. Namely, desired amounts of starting materials Co, Sb and Pd were weighed and melted in an arc-using melting device to obtain an ingot of a molten material. The molten ingot was roughly pulverized in a bowl and then pulverized in a dry system planetary rotatary ball mill to obtain a fine powder of a particle size of not more than 100 μm. The thus prepared powder of alloys was press formed under a pressure of 7 ton/cm², heat treated at 600° C. for 48 hrs, optionally pulverized, further shaped under pressure, and finally or secondary fired at a temperature of 650–800° C. to obtain the samples of Examples 1–7 of the present invention.

Samples of Comparative Examples were prepared in the same manner as described above except that the first firing was performed at a temperature of 600–630° C. Additional samples of Comparative Examples were prepared in the same manner as described above except that the shaped body was obtained by melting and pulverizing a mixture of powders having a reciped ratio of Sb/(Co+Pd) of at least 3 and shaping the pulverized mixture under pressure and the first firing was performed at a temperature of 600° C. in a nitrogen atmosphere under an environmental pressure.

In the above Examples, Pd is an additive for deciding the conductivity type of the thermoelectric material to n-type, and may be substituted by another additive, such as, Ni, Fe, Ru, Sn, Te or Se for deciding the conductivity type. The powders before the first heat treatment are not limited solely to the above melted and pulverized raw materials of the respective elements, and may be substituted by a mixture of powders of the respective elements which were weighed and mixed in desirable amounts for obtaining the desired composition or a mixture of a powder obtained by melting and pulverizing and powders of the respective elements which were weighed and mixed in desirable amounts for obtaining the desired composition.

Examples of relations between the reciped composition used in the Examples and the Comparative Examples and the chemical composition and the crystal phases constituting the obtained sintered cobalt-antimony body are shown in the following Table 1. As clearly seen from the results shown in Table 1, in the range of the ratio of Sb/(Co+Pd)<3, the reciped compositions have no significant influence over the compositions of the sintered bodies, the Sb phase of a low melting point is not precipitated, and the $CoSb_2$ phase and CoSb phase having a high chemical stability at high temperatures are solely contained in addition to the main component $CoSb_3$ phase.

TABLE 1

| | Sample No. | Reciped composition | Sb/ (Co + Pd) | Chemical composition of the sintered body | Formed crystal phases |
|---|---|---|---|---|---|
| Example | 1 | $Co_{0.97}Pd_{0.03}Sb_{2.99}$ | 2.99 | $Co_{0.97}Pd_{0.03}Sb_{2.99}$ | $CoSb_3$, $CoSb_2$ |
| | 4 | $Co_{0.97}Pd_{0.03}Sb_{2.98}$ | 2.98 | $Co_{0.97}Pd_{0.03}Sb_{2.98}$ | $CoSb_3$, $CoSb_2$ |
| | 5 | $Co_{0.97}Pd_{0.03}Sb_{2.97}$ | 2.97 | $Co_{0.97}Pd_{0.03}Sb_{2.97}$ | $CoSb_3$, $CoSb_2$ |
| | 6 | $Co_{0.97}Pd_{0.03}Sb_{2.92}$ | 2.92 | $Co_{0.97}Pd_{0.03}Sb_{2.91}$ | $CoSb_3$, $CoSb_2$, $CoSb$ |
| | 7 | $Co_{0.97}Pd_{0.03}Sb_{2.6}$ | 2.6 | $Co_{0.97}Pd_{0.03}Sb_{2.52}$ | $CoSb_3$, Sb |
| Comparative Example | 11 | $Co_{0.97}Pd_{0.03}Sb_{3.3}$ | 3.3 | $Co_{0.97}Pd_{0.03}Sb_{3.25}$ | $CoSb_3$, Sb |
| | 14 | $Co_{0.97}Pd_{0.03}Sb_{3.1}$ | 3.1 | $Co_{0.97}Pd_{0.03}Sb_{3.07}$ | $CoSb_3$, Sb |
| | 15 | $Co_{0.97}Pd_{0.03}Sb_{3.7}$ | 3.7 | $Co_{0.97}Pd_{0.03}Sb_{3.60}$ | $CoSb_3$, Sb |

Illustrative examples of relations between the reciped composition and the history of preparing the samples used in the Examples and the Comparative Examples and the formed crystal phases are shown in the following Table 2. The formed crystal phases shown in Table 2 are ratios of relative intensities of powders measured by X-ray diffraction. Examples of relations between the history of preparing the samples of the Examples and the Comparative Examples and the bulk density of the obtained samples are shown in the later-described Table 3. As clearly seen from the results shown in Table 2, if the reciped composition is selected to exist within the range of the ratio of Sb/(Co+Pd)<3, the Sb phase having a low melting point is not precipitated at the first heat treatment and the two phases of CoSb phase and $CoSb_2$ phase are constituting the main components of the crystal phases other than the cubic crystal system $CoSb_3$ phase. The constitutional ratios of the crystal phases formed by the second heat treatment have substantially the same tendency as those formed by the first heat treatment. As clearly seen from the results shown in Table 3, the samples are not sufficiently densified by the first heat treatment of the preparation histories, however, the samples can be sufficiently densified or improved by the further firing. In the circumstance, the dense property of the sintered bodies is not changed regardless of performing a pulverizing step after the first heat treatment.

TABLE 2

| Reciped Composition | Sb/ (Co + Pd) | History | Formed crystal phases | | | |
|---|---|---|---|---|---|---|
| | | | Sb | $CoSb_3$ | $CoSb_2$ | CoSb |
| $Co_{0.97}Pd_{0.03}Sb_{2.99}$ | 2.99 | After melting and pulverizing | 37.4 | 52.6 | 1.6 | 8.4 |
| | 2.99 | After the first heat treatment at 600° C. | 0 | 99.0 | 1.0 | 0 |
| | 2.99 | After the second heat treatment at 680° C. | 0 | 99.0 | 1.0 | 0 |
| $Co_{0.97}Pd_{0.03}Sb_{2.98}$ | 2.98 | After melting and pulverizing | 36.2 | 54.7 | 0.5 | 8.6 |
| | 2.98 | After the first heat treatment at 600° C. | 0 | 98.0 | 2.0 | 0 |
| | 2.98 | After the second heat treatment at 680° C. | 0 | 98.0 | 2.0 | 0 |
| $Co_{0.97}Pd_{0.03}Sb_{2.97}$ | 2.97 | After melting and pulverizing | 38.4 | 49.4 | 2.4 | 9.8 |
| | 2.97 | After the first heat treatment at 600° C. | 0 | 99.9 | 0.2 | 0 |
| | 2.97 | After the second heat treatment at 680° C. | 0 | 99.9 | 0.2 | 0 |
| $Co_{0.97}Pd_{0.03}Sb_{2.92}$ | 2.92 | After melting and pulverizing | 37.2 | 51.0 | 3.4 | 8.4 |
| | 2.92 | After the first heat treatment at 600° C. | 0 | 93.4 | 5.2 | 1.4 |
| | 2.92 | After the second heat treatment at 680° C. | 0 | 93.4 | 5.2 | 1.4 |
| $Co_{0.97}Pd_{0.03}Sb_{2.71}$ | 2.71 | After melting and pulverizing | 35.2 | 46.8 | 8.3 | 9.7 |
| | 2.71 | After the first heat treatment at 600° C. | 0 | 85.5 | 9.7 | 4.8 |
| | 2.71 | After the second heat treatment at 680° C. | 0 | 86.1 | 9.6 | 4.3 |
| $Co_{0.97}Pd_{0.03}Sb_{2.68}$ | 2.68 | After melting and pulverizing | 34.9 | 47.0 | 8.6 | 9.5 |
| | 2.68 | After the first heat treatment at 600° C. | 0 | 83.5 | 13.5 | 4.5 |
| | 2.68 | After the second heat treatment at 680° C. | 0 | 82.2 | 12.7 | 5.1 |
| $Co_{0.97}Pd_{0.03}Sb_{2.53}$ | 2.53 | After melting and pulverizing | 34.0 | 45.8 | 9.2 | 11.0 |
| | 2.53 | After the first heat treatment at 600° C. | 0 | 72.0 | 21.5 | 6.5 |
| | 2.53 | After the second heat treatment at 680° C. | 0 | 70.4 | 22.5 | 7 |

TABLE 3

| Reciped Composition | History | Bulk Density ($g/cm^3$) | Remarks |
|---|---|---|---|
| $Co_{0.97}Pd_{0.03}Sb_{2.99}$ | After the first heat treatment at 600° C. | 4.3 | After the first heat treatment, |
| | After the second heat treatment at 650° C. | 6.2 | pulverized and shaped under pressure |
| $Co_{0.97}Pd_{0.03}Sb_{2.99}$ | After the first heat treatment at 600° C. | 4.3 | After the first heat treatment, shaped |
| | After the second heat treatment at 650° C. | 6.2 | under pressure without pulverization |
| $Co_{0.97}Pd_{0.03}Sb_{2.99}$ | After the first heat treatment at 600° C. | 4.2 | After the first heat treatment, |
| | After the second heat treatment at 800° C. | 6.8 | pulverized and shaped under pressure |
| $Co_{0.97}Pd_{0.03}Sb_{2.99}$ | After the first heat treatment at 600° C. | 4.2 | After the first heat treatment, |
| | After the second heat treatment at 750° C. | 6.7 | under pressure without pulverization |

TABLE 3-continued

| Reciped Composition | History | Bulk Density (g/cm³) | Remarks |
|---|---|---|---|
| $Co_{0.97}Pd_{0.03}Sb_{2.8}$ | After the first heat treatment at 600° C. | 4.3 | After the first heat treatment, |
|  | After the second heat treatment at 680° C. | 6.5 | pulverized and shaped under pressure |
| $Co_{0.97}Pd_{0.03}Sb_{2.75}$ | After the first heat treatment at 600° C. | 4.3 | After the first heat treatment, shaped |
|  | After the second heat treatment at 680° C. | 6.5 | under pressure without pulverization |
| $Co_{0.97}Pd_{0.03}Sb_{2.8}$ | After the first heat treatment at 600° C. | 4.3 | After the first heat treatment, |
|  | After the second heat treatment at 750° C. | 6.7 | pulverized and shaped under pressure |
| $Co_{0.97}Pd_{0.03}Sb_{2.75}$ | After the first heat treatment at 600° C. | 4.2 | After the first heat treatment, |
|  | After the second heat treatment at 750° C. | 6.7 | under pressure without pulverization |

Figure 2:
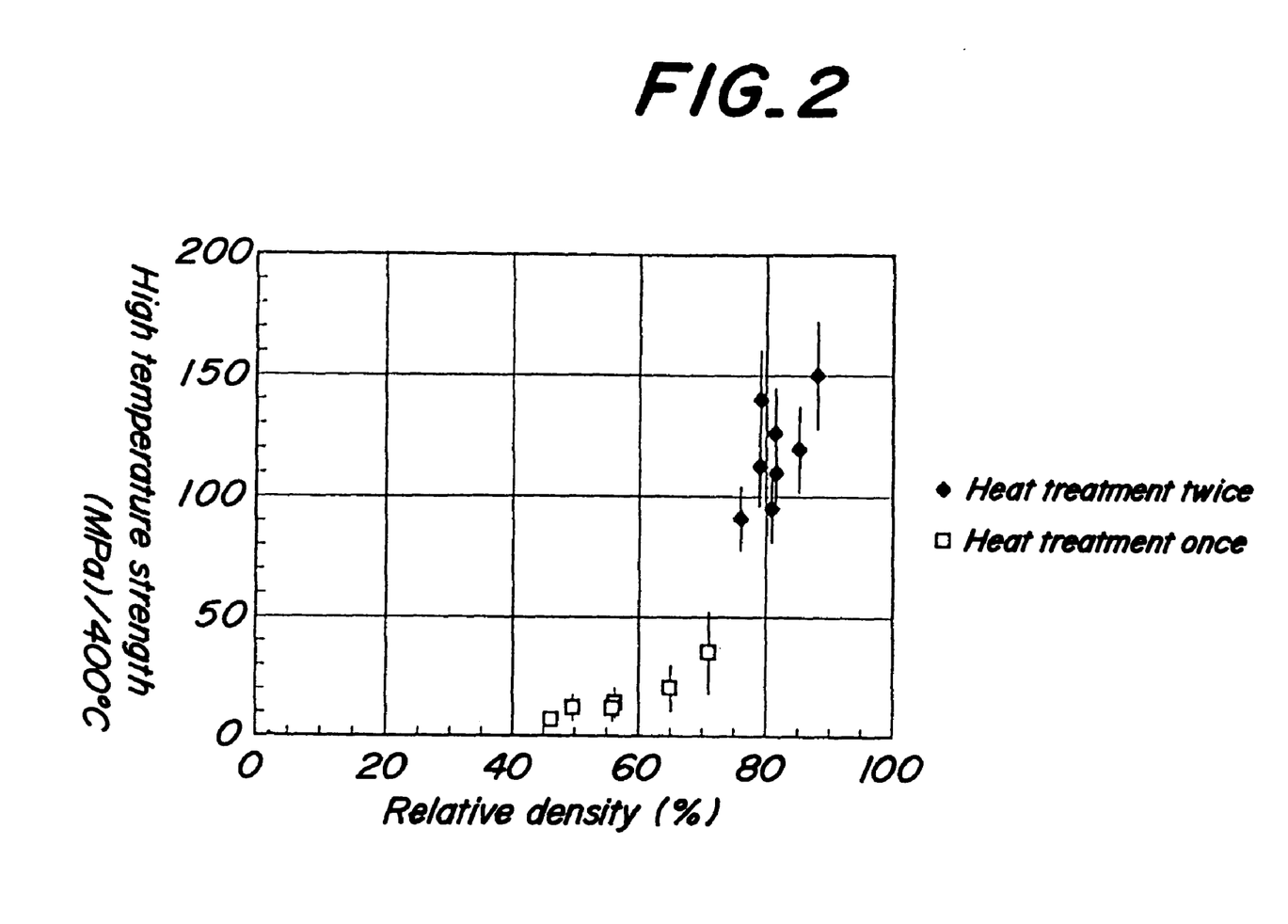
FIG. 2 is a graph showing a relative density-dependency of strength measured at 400° C.
Figure 3:
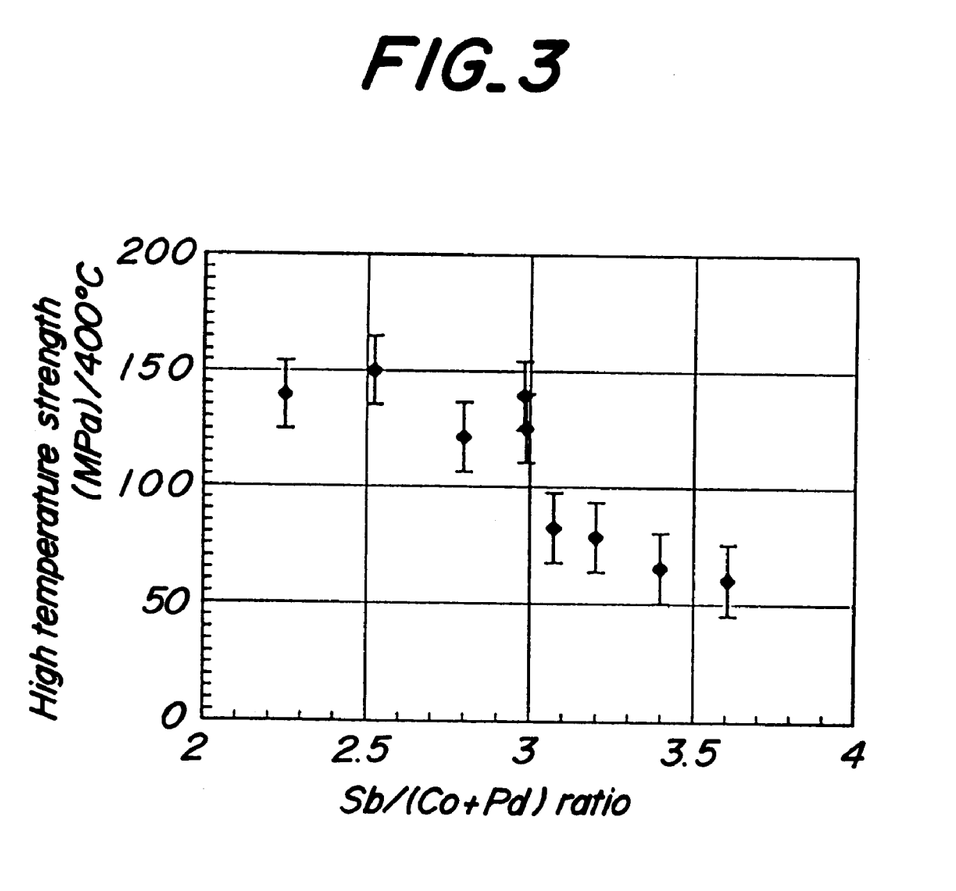
FIG. 3 is a graph showing an Sb amount-dependency of strength measured at 400° C.

A tendency of the measured results of strengths at 400° C. of the cobalt-antimony sintered body having various bulk densities of the Examples and the Comparative Examples of depending on the relative density of the sintered body is shown in the attached FIG. 2. Also, a tendency of the measured results of strengths at 400° C. of the cobalt-antimony sintered bodies prepared by the Examples of depending on the amount of Sb in the sintered bodies is shown in the attached FIG. 3. As clearly seen from the results shown in FIG. 3, the strengths of the samples having relative densities of around 75% are noticeably improved as compared with those of the samples having relative densities of around 70%. Also, as clearly seen from the results shown in FIG. 3, the samples having chemical compositions of Sb/(Co+Pd)>3 have extremely inferior relative strengths at 400° C. as compared with the samples having the chemical compositions within the range of the present invention.

Figure 4:
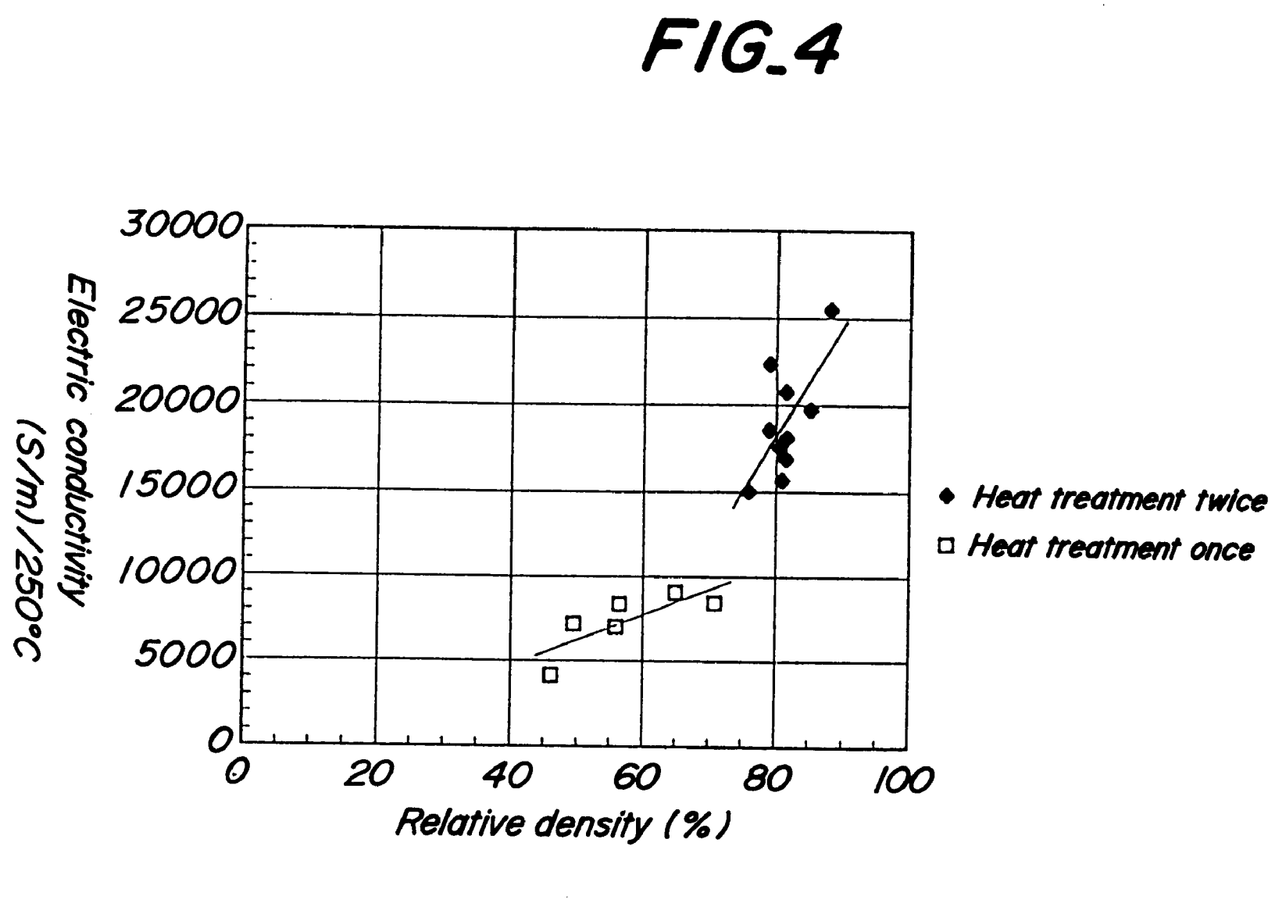
FIG. 4 is a graph showing a relative density-dependency of electric conductivity measured at 250° C.

A tendency of the electrical conductivity at 250° C. of the cobalt-antimony sintered body having various bulk densities of the Examples and the Comparative Examples of depending on the relative density of the sintered body is shown in the attached FIG. 4. As clearly seen from the results shown in FIG. 4, the electrical conductivities of the samples having relative densities of around 75% are noticeably improved as compared with those of the samples having relative densities of around 70%.

Figure 5:
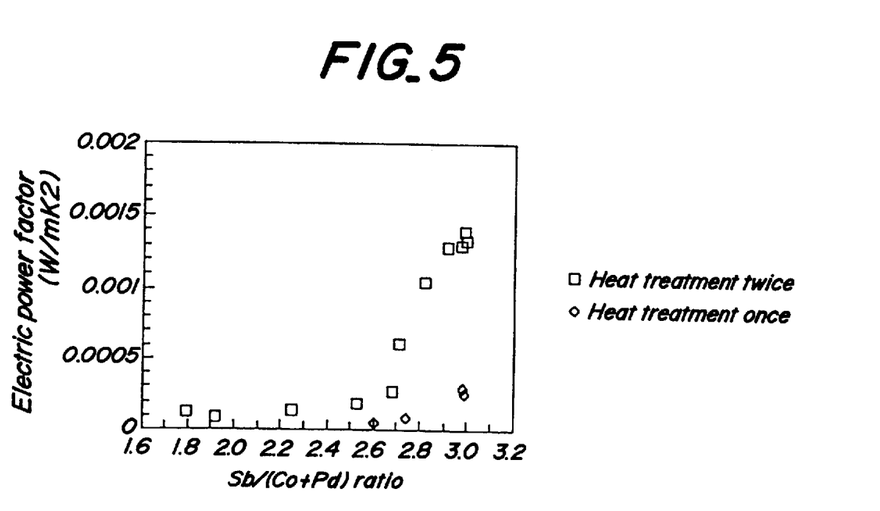
FIG. 5 is a graph showing an Sb amount-dependency of electric power factor Q measured at 300° C.

A tendency of the electric power factor Q (W/mK²) at 300° C. of the cobalt-antimony thermoelectric sintered body containing various amounts of Sb of the Examples of depending on the amount of Sb is shown in the attached FIG. 5. As clearly seen from the results shown in FIG. 5, the samples having chemical compositions of within the range of the present invention have high thermoelectric properties, whereas the samples having chemical compositions of outside of the range of the present invention have extremely inferior thermoelectric properties. For example, the sample having a chemical composition ratio Sb/Co=x of around 2.65 has extremely inferior thermoelectric properties as compared with the sample having a chemical composition ratio Sb/Co=x of around 2.75 which is substantially the same order with those of the sample of the Comparative Example having a relative density of less than 70% and a chemical composition ratio Sb/Co=x of around 2.98.

Relations between the chemical composition of the sintered body, the constitutional ratio of the formed crystal phases expressed by the intensity ratio measured by X-ray diffraction and the maximum value of the character index are shown in the following Table 4. As clearly seen from the results shown in Table 4, the samples having the constitutional ratio of the formed crystal phases of within the present invention have far superior thermoelectric properties than the samples having the constitutional ratio of the formed crystal phases of outside of the present invention.

TABLE 4

| Intensity ratio of crystal phases formed in the sintered body (total = 100) | | | Maximum value of electric power factor |
|---|---|---|---|
| $CoSb_3$ | $CoSb_2$ | CoSb | (W/mK²) |
| 99.0 | 1.0 | 0 | 1.4 × 10⁻³ |
| 98.0 | 2.0 | 0 | 1.3 × 10⁻³ |
| 96.1 | 2.9 | 1 | 1.3 × 10⁻³ |
| 93.4 | 5.2 | 1.4 | 1.0 × 10⁻³ |
| 86.1 | 9.6 | 4.3 | 6.1 × 10⁻⁴ |
| 83.5 | 13.5 | 4.5 | 3.0 × 10⁻⁴ |
| 70.4 | 22.5 | 7 | 1.0 × 10⁻⁴ |
| 7.5 | 74.6 | 17.9 | 1.3 × 10⁻⁴ |

Figure 6:
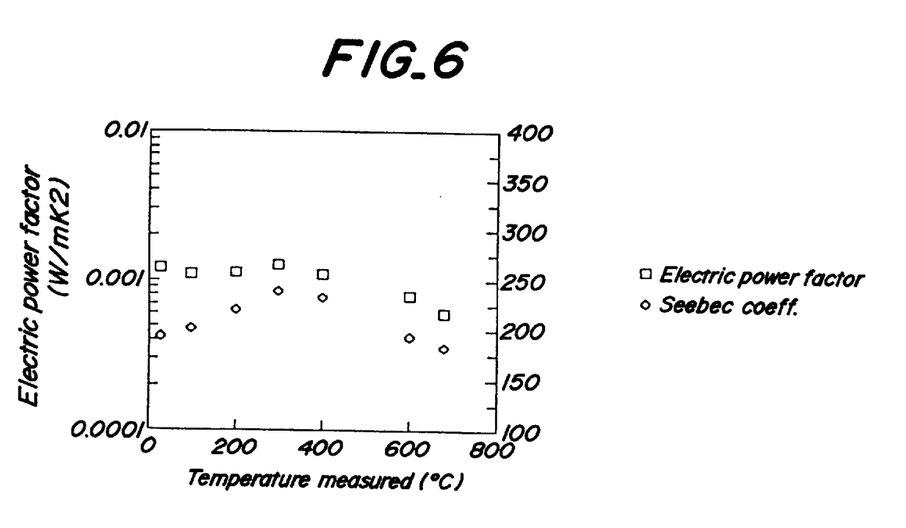
FIG. 6 is a graph showing a temperature-dependency of electric power factor Q and Seebeck coefficient α of a sintered body of cobalt·antimony having an Sb/(Co+additives) ratio of 2.9.

A tendency of the Seebeck coefficient α(μ V/K) and the electric power factor Q (W/mK²) of the thermoelectric cobalt-antimony sintered body containing Sb in such an amount to give a chemical composition ratio x=Sb/(Co+additives) of 2.9 of depending on the temperature is shown in the attached FIG. 6. As clearly seen from the results shown in FIG. 6, the thermoelectric properties of the samples of the Examples containing a Sb amount satisfying a chemical composition ratio x=Sb/(Co+additives) of 2.9 are not deteriorated but maintained high at high temperatures of not less than 600° C.

Therefore, as explained in the foregoing explanations, by incorporating a small amount of Sb in a given range into the stoichiometrical composition of $CoSb_3$, a highly chemically stable thermoelectric material for high temperature use can be provided which consists of a major component $CoSb_3$ and highly chemically stable subsidiary components of CoSb and $CoSb_2$ solely as the components other than the major component $CoSb_3$ and which has a high strength, superior thermoelectric properties and a sufficient heat resistant property at high temperatures with a scarce decrease of the characteristic properties at high temperatures.

By using shaped bodies of compositions containing a small amount of Sb within a certain range in the stoichiometrical composition of $CoSb_3$ and not having a concern of precipitating Sb phase considering the results shown in Tables 1–3, a thermoelectric material consisting of a major component $CoSb_3$ and highly chemically stable subsidiary components of CoSb and $CoSb_2$ solely as the subsidiary components other than the major component $CoSb_3$ and having superior thermoelectric properties can be obtained by using a general sintering method. Therefore, an industrially useful method of economically and efficiently producing a thermoelectric material for high temperature use can be provided. Also, as compared with the method of heat treating a molten ingot having many segregations, the heat treatment subjected on the agglomerates of the powders can decrease the time of diffusion required for obtaining a homogeneous composition. Therefore, by using a preliminarily heat treated shaped body of powders as the sample before the firing, an industrially useful, simple, economical and easy method of producing a thermoelectric material can be provided with a much decreased production time.

The thermoelectric material of this type has the crystal structure of the cubic crystal system CoSb as the fundamental structure, so that respective material containing p-type or n-type impurities has a same crystal structure.

Thus, thermal stability and coefficient of thermal expansion of the respective material can be regarded as a same material, so that the shaping of the powders having p-n junction can be facilitated, and a thermoelectric material having a superior heat resistant property and shaping property can be provided which is much economical and chemically stable in a wide temperature range of from room temperature to 600° C. or more with a scarce decrease of the thermal property, and a method for producing the same can be realized.

As explained in detail in the foregoing explanations, the thermoelectric material of the present invention is constituted mainly by cobalt·antimony compounds and has a chemical composition ratio of Sb/(Co+additives)=x of 2.7<x<3, so that it has high thermoelectric properties as compared with the heretofore known $FeSi_2$ and the like silicide compounds. Meanwhile, it enables a possibility that it can be a thermoelectric material having a higher use temperature range than PbFe, so that it realizes the provision of a thermoelectric material for high temperature use having a sufficient heat resistant property and chemical stability for high temperature use and superior thermoelectric properties with a scarce decrease of the characteristic properties.

Also, by virtue of heat treating the shaped body of powders having an elemental ratio Sb/(Co+additives)=y of 2.7<x<3 in a non-oxidizing atmosphere, shaping it under pressure or shaping it under pressure after pulverizing, and firing the shaped body, the present invention can provide an industrially useful, economical and efficient method of producing a thermoelectric material, particularly a dense sintered body having high thermoelectric properties at high temperatures of exceeding 600° C., while using a general sintering method.

Although the present invention has been explained with specific examples and numeral values, it is of course apparent to those skilled in the art that various changes and modifications thereof are possible without departing from the broad spirit and aspect of the present invention as defined in the appended claims.

We claim:

1. A thermoelectric material for use at temperatures greater than 600° C. comprising:

a sintered body having a relative density of at least 75% and comprising cobalt·-antimony compounds, wherein the elemental ratio Sb/(Co+additives)=x and x is in the range of 2.7<x<3.

2. The thermoelectric material according to claim 1, wherein crystal phases of the cobalt·-antimony compounds include an A phase cubic crystal system compound $CoSb_3$, a B phase monoclinic crystal system compound $CoSb_2$ and a C phase hexagonal crystal system compound CoSb, and the constitutional ratio of the crystal phases is $(I_B+I_C)/(I_A+I_B+I_C)<0.15$, wherein $I_A$, $I_B$ and $I_C$ are relative intensities measured by X-ray diffraction, said ratio being greater than zero.

3. A method of producing a thermoelectric material for use at temperatures greater than 600° C. including a step of firing a shaped body of powders comprising cobalt and antimony in a non-oxidizing atmosphere at an environmental pressure, the shaped body comprising crystal phases including an A phase cubic crystal system compound $CoSb_3$, a B phase monoclinic crystal system compound $CoSb_2$ and a C phase hexagonal crystal system compound CoSb, and the constitutional ratio of the crystal phases is $(I_B+I_C)/(I_A+I_B+I_C)<0.15$, wherein $I_A$, $I_B$ and $I_C$ are relative intensities measured by X-ray diffraction, said ratio being greater than zero.

4. The method according to claim 3, wherein the shaped body before firing is obtained by shaping powders having an elemental ratio of Sb/(Co+additives=x of 2.7<x<3 under pressure, heat treating the shaped body, and further shaping under pressure or shaping under pressure after pulverizing.

* * * * *